United States Patent [19]
Chan et al.

[11] Patent Number: 5,855,820
[45] Date of Patent: Jan. 5, 1999

[54] WATER BASED THICK FILM CONDUCTIVE COMPOSITIONS

[75] Inventors: Man-Sheung Chan, Chapel Hill; Jay Robert Dorfman, Durham, both of N.C.

[73] Assignee: E. I. du Pont de Nemours and Company, Wilmington, Del.

[21] Appl. No.: 969,505

[22] Filed: Nov. 13, 1997

[51] Int. Cl.$^6$ ................................ H01B 1/22; H01B 1/24
[52] U.S. Cl. ........................ 252/511; 252/512; 252/514
[58] Field of Search ................................ 252/511, 512, 252/514; 524/457

[56] References Cited

U.S. PATENT DOCUMENTS

| | | | |
|---|---|---|---|
| 4,715,989 | 12/1987 | Sullivan et al. | 252/512 |
| 4,950,423 | 8/1990 | Sullivan | 252/512 |
| 5,231,113 | 7/1993 | Chandraratna et al. | 514/510 |
| 5,286,415 | 2/1994 | Buckley et al. | 252/502 |
| 5,492,653 | 2/1996 | Hochheimer et al. | 252/514 |
| 5,574,079 | 11/1996 | Eaton et al. | 523/423 |

OTHER PUBLICATIONS

Progress in Organic Coatings, vol. 9, 1981, Aqueous Emulsions, Dispersions and . . . , Dieterich, pp. 281–340 (no month).

*Primary Examiner*—Mark Kopec

[57] ABSTRACT

The present invention is a thick film water based conductive coating composition comprising, based on total composition: (a) 5–40% wt. first aqueous dispersion of polyhydroxyether polymer grafted with at least one acrylic or methacrylic monomer wherein the dispersion is 25–40% wt. grafted polymer solids; (b) 20–80% wt. finely divided metallic electrically conductive particles selected from the group consisting of silver, copper, nickel, silver coated copper, silver coated nickel, carbon, graphite and mixtures thereof; (c) 0–20% by wt. second aqueous dispersion of an acrylic or polyurethane polymer wherein the dispersion is 25–40% wt. polymer solids; (d) 0–5% wt. water soluble polymer; and wherein all of (a), (b), (c) and (d) are dispersed in water and about 1–8% wt. co-solvent.

10 Claims, No Drawings

WATER BASED THICK FILM CONDUCTIVE COMPOSITIONS

FIELD OF THE INVENTION

This invention relates to an improvement in coating compositions containing conductive particles suspended in aqueous polymer dispersions suitable for use in providing conductive coatings.

BACKGROUND OF THE INVENTION

Electrically conductive coatings are useful in a variety of applications, such as in EMI/RFI shielding for electronic devices, conductive coatings for electrodes in medical devices such as electrocardiograph (EKG) electrodes and conductive coatings for corrosion prevention. In the industry today, the most widely used conductive coating compositions are solvent based which have a potential of polluting the environment. The need to reduce pollution from volatile organic chemicals (VOC) have led the coating industry and government agencies to push for low VOC thick film coating compositions such as water based thick film coating compositions.

In the prior art of water based electrically conductive coating compositions, polymer latex and aqueous solutions of water soluble polymers are commonly used. U.S. Pat. Nos. 4,715,989 and 4,950,423 describe water based conductive compositions containing metal powders, latex of acrylic copolymer and aqueous dispersion of polyurethane. U.S. Pat. No. 5,286,415 describes an aqueous polymer thick film composition comprising metal particles, a water-soluble thermoplastic polymer and a polymer dispersion. U.S. Pat. No. 5,492,653 describes an aqueous silver composition having a water-soluble polymer as the polymeric binder. Dried coatings of the above-described electrically conductive compositions suffer from sensitivity to water and alcohol due to the presence of water-soluble polymers or hydrophilic components in the polymeric binders. These conductive compositions generally also have low coating hardness due to the use of thermoplastic polymers of relatively low glass transition temperature Tg. Therefore, there remains a need for a water based coating composition that can provide an electrically conductive coating with good solvent resistance and good scratch resistance. The present invention fills that need.

SUMMARY OF THE INVENTION

The present invention is a thick film water based conductive coating composition comprising, based on total composition:

(a) 5–40% wt. first aqueous dispersion of polyhydroxyether polymer grafted with at least one acrylic or methacrylic monomer wherein the dispersion is 25–40% wt. grafted polymer solids;

(b) 20–80% wt. finely divided metallic electrically conductive particles selected from the group consisting of silver, copper, nickel, silver coated copper, silver coated nickel, carbon, graphite and mixtures thereof;

(c) 0–20% by wt. second aqueous dispersion of an acrylic or polyurethane polymer wherein the dispersion is 25–40% wt. polymer solids;

(d) 0–5% wt. water soluble polymer; and wherein all of (a), (b), (c) and (d) are dispersed in water and about 1–8% wt. co-solvent.

DETAILED DESCRIPTION OF THE INVENTION

A. Conductive Component

The electrically conductive component of the present invention comprises finely divided particles of electrically conductive materials, such as silver or silver-silver chloride, copper, nickel, conductive carbon or graphite or mixtures thereof. This includes mixtures of the metallics and the carbon and graphite components. Silver coated copper and nickel flakes due to superior resistance to air oxidation over pure copper or nickel flakes are preferred which achieve stable resistivity. Flake particles in the range of 1–30 microns are preferred to achieve high electrical conductivity and particle dispersion stability. Silver flake often comes with up to 0.5% adsorbed surfactants to stabilize the silver particles in liquid dispersions. For conductive carbon coating compositions, carbon or graphite may be used but a mixture of amorphous conductive carbon and graphite are the preferred fillers. The conductive particles compose 20–80% wt. of the composition with 30–80% wt. preferred for compositions containing silver, silver-silver chloride, copper, nickel, silver coated copper, silver coated nickel or mixtures thereof and 20–40% wt. preferred for compositions containing conductive carbon or graphite or mixtures thereof. For electrocardiograph (EKG) electrode application the conductive component may incorporate 2–30% wt. of silver chloride particles in a silver—silver chloride mixture.

B. Polymer Binder Component

Dispersion of Polyhydroxyether Polymer

The dispersion of polyhydroxyether polymer used in the present invention comprise 5–40% wt. based on total composition and are aqueous dispersions of a suitable high Tg polymer such as a polyhydroxyether polymer, commonly known as phenoxy resin, grafted with at least one carboxyl containing acrylic/methacrylic monomer. Aqueous dispersions of this polymer are commercially available as waterborne phenoxy resins from Phenoxy Specialties, Inc. U.S. Pat. No. 5,574,079 describes the art in preparing such a water-borne phenoxy resin. Furthermore, mixtures of this water-borne resin with an aqueous acrylic dispersion such as ABP resin from DuPont or an aqueous polyurethane dispersion such as NeoRez R9699 from Zeneca can also provide useful aqueous polymeric dispersions for the conductive compositions of this invention. The aqueous polymer dispersion typically has 25–40% polymer solids. In metal-containing conductive compositions of the present invention, the polymeric binder is used in the preferred range of 5–25% by wt. or 30–60% by volume of the dry coating composition with a more preferred range of 8–15% wt. If less than 30% by volume of polymer binder is used, the resulting coating film's integrity is compromised by affecting the film's cohesion. If greater than 60% by volume is used, the resulting film's electrical conductivity diminishes. For carbon-containing conductive compositions, the preferred % polymeric binder is in the range of 15–25% wt. based on the total.

The polyhydroxyether grafted polymer with a carboxyl containing acrylic/methacrylic monomer is prepared by grafting one or more ethylenically unsaturated monomers, preferably having 3 to about 8 carbons, onto a thermoplastic polyhydroxyether having a narrow polydispersity. ($M_w/M_n<4; 7000<M_n<12,000$). It is desirable that at least one of the monomers contain sufficient carboxyl groups to provide from about 1 to 100 carboxyl groups per 10 monomeric units of thermoplastic polyhydroxyether. The resulting grafted thermoplastic polyhydroxyether and conductive particles are then blended with water and a water-miscible co-solvent resulting in a usable coating composition.

Dispersion of Acrylic or Polyurethane Polymer

The aqueous dispersion of polyhydroxyether may be blended with about 20% wt. or less of an aqueous dispersion of acrylic or urethane polymer. The aqueous acrylic or polyurethane polymer dispersion has 25–40% wt. polymer solids. The preferred blending ratio is in the range of 9/1 to 6/4 by weight of polymer solids for the polyhydroxyether/ acrylic or polyhydroxyether/urethane. The more preferred blends are in the range of 8/2 to 7/3.

Acrylic polymer dispersions used in this invention are aqueous branched polymers. The acrylic polymers are grafted copolymers which may be prepared from ethylenically unsaturated monomers, such as alkyl esters or amide of acrylic acid or methacrylic acid, styrene, acrylonitrile or methacrylonitrile. The grafted copolymer has a linear polymer backbone with a molecular weight of 2,000–200,000 and side chains with a molecular weight of 1,000–30,000. Preferred molecular weights of the copolymers are 2,000–100,000 for the grafted copolymer and 1,000–20,000 molecular weight for the side chains. The grafted copolymer has a polymer backbone having hydrophilic carboxylic acid pendant groups partially neutralized with alkyl amine and side chains made up of hydrophobic monomers. The polymer backbone is preferably based on 2–30% by weight of methacrylic acid. When neutralized with an organic base and mixed with water, the dispersed polymer typically has average particle size of 10 to 1000 nm, preferably 20 to 400 nm. A preferred acrylic polymer dispersion suitable for this invention is an aqueous branched polymer dispersion described in DuPont U.S. patent application Ser. No. 08/184, 525.

Another example of an acrylic polymer dispersion suitable for use in this invention is an aqueous branched polymer dispersion described in U.S. Pat. No. 5,231,131 which is incorporated herein as reference. The acrylic polymer is a grafted copolymer having hydrophobic backbone and side chains with hydrophilic carboxylic acid pendant groups. Preferred molecular weights are 40,000–150,000 for the grafted polymer and 1000–7000 for the side chains. Such a grafted polymer is prepared from an acrylic macromonomer with hydrophilic pendant carboxylic groups and acrylic monomers.

Polyurethanes used in the present invention include any polyurethane that is water dispersible. These are hydrophilic polyurethanes with ionic groups (e.g., hydrophilic moieties) on the polymer backbone having hydrophilic carboxylic acid pendant groups which are neutralized with alkyl amines. Exemplary polyurethanes are dispersions as illustrated in the Dieterich article "Aqueous Emulsions, Dispersion and Solutions of Polyurethanes; Synthesis and Properties" in Progress in Organic Coatings, Vol. 9, pp. 281–340 (1981). The preferred polyurethane dispersions used in the present invention are carboxylated aliphatic polyester polyether urethanes. This polyurethane has pendant carboxylic acid groups on a polymer chain. When reacted with an organic base, such as an alkyl amine, the pendant groups are converted into alkyl ammonium carboxylate groups and the polyurethane polymer turns into fine polymer particles dispersible in water. These polyurethane dispersions are commercially available from Zeneca Corporation under the NeoRez® trademark. Other suitable polyurethane dispersions are available from Mobay Corporation.

The above-mentioned water based binders can be modified with an optional crosslinker that reacts with the carboxylate groups on the acrylic and urethane polymers. The crosslinked polymers provide greater hardness to the coating. Water soluble crosslinking agents suitable for such crosslinking reactions are from the families of aziridine, melamine formaldehyde and phenol formaldehyde resin.

Other Components

In order to maintain good dispersion stability of the metal or carbon particles a surfactant may be added to the conductive compositions in this invention. Surfactants suitable for the water based conductive compositions are anionic surfactants from the families of long-chain aliphatic carboxylic acid and their salt such as oleic acid and sodium stearate, nonionic surfactants from the families of alkyl polyether alcohol widely marketed as Triton* and Tergital* from Union Carbide, CT.

Up to 5% wt. with 1–3% wt. preferred water soluble or water dispersible polymeric thickening agents and mixtures thereof are often added to raise the viscosity. Common water soluble polymers such as polyacrylamide, polyacrylic acid, polyvinylpyrrolidone, polyvinylpyrrolidone-vinyl acetate copolymer, polyvinyl alcohol, poly(ethylene-oxide) and swellable acrylic dispersion widely marketed as Acrysol* from Rohm-Haas PA are suitable for the compositions in this invention. When using silver-silver chloride conductive coating as electrodes in electrochemical/medical applications, it is desirable to incorporate a hydrophilic binder to the polymer matrix to enhance the ion transport. A water soluble polymer is blended with the aqueous dispersion of polyhydroxyether to provide a partially hydrophilic binder for a Ag/AgCl composition suitable for use in making a good EKG or electrochemical electrode.

C. Co-Solvent and Water

About 1–8% wt. of co-solvent is included in the water based coating composition. The preferred composition has 3–6% wt. co-solvent. These co-solvents function as coalescent agents for polymer particles to aid the film-forming process during drying, and also serve as wetting agents and adhesion promoters on plastic film surfaces. Examples of co-solvents come from the families of glycols such as ethylene, propylene glycol or the like; mono and dialkylethers of ethylene or propylene glycol widely marketed as Cellosolve® from Union Carbide, CT and as Arcosolve® from ARCO Chemicals, PA and Dowanol® from DOW, MI, and the family of alkanols such a butanol, pentanol and hexanol.

The solid components of the composition are dispersed in water. The amount of water must be sufficient to provide good rheology qualities and suitable consistency for the method of application. The main purpose of the water is to serve as a vehicle for dispersion of the solids of the composition in such a form that it can readily be applied to a substrate. Deionized or distilled water is preferred for use in the composition. The deionized or distilled water insures dispersion and stability to the composition by reducing any ionic contribution from the water.

D. General Composition Preparation and Printing Procedures

The water-based coating composition is typically prepared by milling the conductive powder with a polyhydroxyether polymer as described above or a dispersion blend of the polymer and an acrylic or urethane resin. The resulting dispersion is the blended with additional water based polymer binder resin and conductive powder under vigorous agitation to thoroughly disperse the conductive powder.

The conductive composition can be applied by conventional coating processes. For coating plastic parts with 3-dimensional shape, air spraying, dip-coating are commonly used. For coating on a flat surface such as plastic sheets or films, roll coating, screen printing or gravure/ flexographic printing are cost effective method for applying a conductive coating on the substrate.

For use in disposable EKG electrodes, a thin coating of the composition is applied on a dimensionally stable dielectric film substrate. The typical coating will have a thickness less than 0.3 mil with the resulting coat weight being less than 1.2 milligram/sq. cm. The preferred film substrates for EKG electrodes are plastic films frog the families of copolyester, polycarbonate, and polyetherimide polyvinylchloride films. In some applications a very thin silver-silver chloride coating (<0.1 mil) printed on a conductive carbon-filled polyvinylchloride film or a polyester film With a conductive-carbon ink coating can be used to further reduce the electrode cost. In yet another application, a very thin (<0.1 mil) Ag coating can be printed on a silver conductive coating to provide electrodes with very high conductivity.

Printing of a silver-silver chloride ink is preferably carried out on a flexographic or gravure printing press. These processes allow for the production of very thin continuous uniform coatings with multiple prints at high throughput lad low manufacturing cost.

A flexographic or gravure printing press consists of multiple coating heads, a web handling assembly and a long drier. Each coating head is part of an assembly of a coating pan, an assembly of rollers and a short drying oven and provides one print on a plastic film web. In a typical coating run, ink liquid is loaded into the coating pan. A wet coating of ink is picked up by the rolling gravure or fountain roll which dips into the ink in the coating pan. As the rolling gravure roll presses on the moving web of plastic film, which wraps around the impression roll, the wet coating is transferred onto the plastic film. The flexographic method picks up the ink by an engraved roll, which the ink is then transferred onto, a rubber roll with the printing pattern which in turn is printed onto a moving film substrate. The coating on the moving film web is dried to a tack-free state in the short oven. Multiple prints are repeated on the multiple printing heads to provide the targeted coating thickness. The web finally passes through the long drier to fully dry the coating. To achieve consistent coating quality, it is important to optimize parameters, such as coating thickness, web speed, oven temperature, and air flow rate. If dilution of the composition is needed, the coating parameters should be adjusted accordingly to match changes in ink properties, such as % solids, viscosity, and solvent drying rate. For water-based compositions, care should also be taken to avoid foaming when the composition is circulated to the coating pan by pumping.

TEST PROCEDURES

Resistance

This test is designed to measure the resistivity of certain conductor compositions on a Mylar® substrate.

Procedure

1. Mix the sample thoroughly to assure uniform consistency.
2. A coating of the conductive composition was applied on a polyester film substrate by air spraying or drawdown with a wirewound rod and dried at 70°–100° C. Typical coating thickness was 0.5–2 mil.
3. Electrical resistance across a coating strip of 5 inches by ¼ inch was measured using 4-point probe. 4. Resistivity in mohm/sq/mil was calculated as follows:

Resistivity=Avg. Measured Resist. (mohmn)×Avg. Thick.(mil)/20

Pencil Hardness

Determine the film hardness of the conductor compositions printed on Mylar® substrates according to ASTM-D-3363-92a.

Procedure

1. Mix the sample thoroughly to assure uniform consistency.
2. Prepare a 1 mil dry coating of conductive composition
3. Use acceptable brand of pencils(2) with calibrated lead—hardness.

The commonly used scale for pencil hardness is:

6B  5B  4B  3B  2B  B  HBH  2H  3H  4H  5H  6H  7H  8H  9H  > Hard

4. If wood pencils are used they should be sharpened to get a smooth cylinder of lead. Holding the pencil or lead holder at an angle of 90° to an abrasive paper (grit No. 90), rub the lead against the paper until a flat, smooth and circular cross section is obtained, free of chips and nicks on the edges.
5. Starting with the hardest lead, hold the pencil firmly with the lead against the film at a 45° angle (point away from the operator) and push away from the operator. Use a fresh edge on the lead before every test.
6. Repeat this process down the hardness scale until a pencil is found that will not cut through the film to the substrate. A failure is defined as 4 or more broken lines out of the 10 lines of the pattern.

EXAMPLES

The present invention will be described in further detail by giving practical examples. The scope of the present invention, however, is not limited in any way by these practical examples.

EXAMPLE 1

This example describes the preparation of a silver conductive ink using a fine silver flake with an average particle size D50 of 4–5 microns. The ingredients listed below were added to an 8 ounce jar with mixing. The mixture was mixed at vigorous agitation for 30 minutes with a magnetic stir bar on a stirring plate. The resultant mixture has a viscosity of 25 seconds in a #2 Zahn cup. The mixture was then sprayed on a 5 mil PET film using an air brush operated at 40–60 psi air pressure. The wet coating was dried in air for 5 minutes and then in a 70° C. drying oven for 5 minutes to a coating thickness of 0.5 mil. The dry coating was measured for sheet resistivity. Typical sheet resistivity was 45 mohm/square/mil and coating pencil hardness as measured according to ASTM-D-3363-92a was H.

| Ingredient | Weight |
| --- | --- |
| Aqueous phenoxy dispersion[1] | 28 parts |
| Propylene glycol n-propyl ether[2] | 2.5 parts |
| Deionized water | 15.0 parts |
| Silver flake[3] | 62.0 parts |

[1]Phenoxy PKHW-34X from Phenoxy Associates, SC
[2]Arcosolve* PNP from ARCO Chemicals, PA
[3]Silver flake with D50 of 3–5 microns such as K003L by DuPont, DE

EXAMPLE 2

A conductive paint containing a large silver flake and a blend of water based phenoxy and water based polyurethane was prepared in the same way as Example 1 using the ingredients listed below. The silver paint was sprayed on a 5 mil PET film to achieve a coating thickness of 1 mil. The sheet resistivity was measured to be 41 mohm/sq/mil. Typical coating pencil hardness was HB.

| Ingredient | Weight |
| --- | --- |
| Aqueous phenoxy dispersion | 23.04% |
| Aqueous polyurethane resin[4] | 4.93% |
| Propylene glycol n-propyl ether | 4.99% |
| Deionized water | 24.97% |
| Silver flake | 41.14% |
| Acrylic thickener ASE-60[5] | 0.53% |
| 10% ammonia solution | 0.4% |

[4]Neorez R-9699 resin by Zeneca, MS
[5]Acrysol ASE-60 Rohm-Haas, PA

EXAMPLE 3

A silver conductive paint was prepared using a blend of phenoxy dispersion and an acrylic dispersion in the same way as Example 1. The sheet resistivity was 26 mohm/sq/mil and coating pencil hardness was HB.

| Ingredient | Weight Percent |
| --- | --- |
| Aqueous phenoxy dispersion | 14.06% |
| Aqueous acrylic dispersion | 15.97% |
| Propylene glycol n-propyl ether | 4.82% |
| Deionized water | 24.09% |
| Acrysol ASE-60 | 0.50% |
| 10% ammonia solution | 0.40% |
| Silver flake[6] | 40.16% |

[6]Silver flake AB0222 from Chemet, RI

EXAMPLE 4

This example describes the formulation of a water based conductive copper paint. The ingredients listed below were prepared in the same way as Example 1. The resultant paint has a % solids of 44.4% and a viscosity of 35 seconds #2 Zahn cup. Paint sample was sprayed on a 5 mil PET film substrate, dried in air for 5 minutes and then 5 minutes at 70° C. for 5 minutes. Coating thickness was 1 mil. The measured sheet resistivity was: 87 mohm/sq/mil. Typical coating hardness was 4H.

| Ingredient | Weight |
| --- | --- |
| Aqueous phenoxy dispersion | 42 parts |
| Copper flake[7] | 51 parts |
| Deionized water | 46 parts |
| Propylene glycol n-propyl ether | 9 parts |
| Sodium stearate | 0.5 part |

[7]Copper flake with 5% silver coating from Degussa, NJ

EXAMPLE 5

The preparation of a water based conductive carbon ink is described below. A water based dispersion (a) of a conductive amorphous carbon was prepared by milling 12.0 grams of amorphous carbon black (VULCAN 400R from Cabot, Mass.) and 0.36 grams of sodium stearate in 99 grams of deionized water and 11.0 grams of propylene glycol n-propyl ether in ajar mill with ½" cylindrical ceramic milling media. To make the carbon ink,38.6 grams of dispersion (a), 12.2 grams of PKHW-34X resin 8.4 grams of a 5/1 of deionized water/propylene glycol n-propyl ether mixture, 8.8 grams of graphite (Timcal SFG-6 from Timcal America, OH) were mixed at high speed agitation for 30 minutes. The resultant water based ink had a viscosity of 29 seconds #2 Zahn cup. A conductive carbon coating of the ink sample was coated on a 5 mil PET film substrate using a #12 drawdown rod and then dried at 70° C. for 5 minutes. Three repeated drawdowns were made to build up coating thickness of 0.6 mil. The carbon coating had sheet resistivity of 23 ohm/square/mil. The pencil hardness was HB.

EXAMPLE 6

A silver-silver chloride (Ag/AgCl) composition containing water based phenoxy and a water soluble polymer suitable for coating disposable EKG electrode. A AgCl dispersion containing 39.3% of AgCl powder (Colonial Metals Inc., DE), 21.4% of aqueous phenoxy dispersion, 35.7% of deionized water and 3.6% of propylene glycol n-propyl ether was first prepared by milling the mixture in ajar mill with ceramic medium to disperse Ag/AgCl particles. A conductive composition was then prepared by mixing the AgCl dispersion, silver flakes and aqueous phenoxy dispersion in the same was as Example 1. A coating of the Ag/AgCl ink was prepared by tow drawdowns using a #10 wire-wound rod and then dried at 70° C. for 5 minutes. Measured sheet resistivity was 48 mohm/sq/mil and pencil hardness was H.

| Ingredient | Percent Weight |
| --- | --- |
| Aqueous phenoxy dispersion | 14.0% |
| polyvinylpyrrolidone vinyl acetate | 1.4% |
| Silver flake | 51.7% |
| AgCl dispersion | 32.9% |

EXAMPLE 7

A Ag/AgCl composition suitable for coating disposable EKG electrode was prepared in the same way as example 6. A AgCl dispersion containing 40% of AgCl powder, 21.5% of aqueous phenoxy dispersion, 32.1% of deionized water and 6.4% of propylene glycol n-propyl ether was used. Typical sheet resistivity was 45mohm/sq/mil and pencil hardness was HB.

| Ingredient | Percent Weight |
| --- | --- |
| Aqueous phenoxy dispersion | 14.3% |
| Deionized water | 5.3% |
| Propylene glycol n-propyl ether | .7% |
| Silver flake | 49.2% |
| AgCl dispersion | 30.5% |

EXAMPLE 8

This example demonstrates the printing of Ag/AgCl coating for EKG application. Ag/AgCl ink in Examples 6 and 7 were printed on a 3 mil polyester film using a Rotogravure hand proofer with a 250 line engraved cylinder. Three consecutive print and 5 minutes at 70° C. drying steps were made to achieve a final coat weight of 0.8–1.1 milligram/cm2. Alternatively, one print of Ag/AgCl was applied on a carbon conductive coating printed with carbon ink in Example 5 or an Ag conductive coating printed with Ag ink in Example 1 to make EKG electrodes. EKG testings were done on two pieces (1 inch×2 inches) of each Ag/AgCl coating with Promeon RG63B hydrogel laminated on the Ag/AgCl side as the conductive adhesive. An Xtratek tester was used to measure the EKG properties according to AMIA specifications. Typical EKG properties are listed below:

|  | Ex. 6 | Ex. 7 | Ex.7 on 5 | Ex. 7 on 1 |
|---|---|---|---|---|
| DC Offset (milivolt) | 0.6 | 0.7 | 0 | 0.4 |
| AC Impedance (ohm) | 43 | 52 | 127 | 49 |
| Simulated Defribilation Recovery (SDR) | | | | |
| DC Offset (milivolt) | 2.1 | 12.9 | 16.6 | 16.3 |
| Slope (milivolt/sec) | 0.35 | 0.38 | 0.41 | 0.44 |
| AC Impedance (ohm) | 33 | 34 | 119 | 42 |

EXAMPLE 9

The following added together in a vessel and mixed for approximately 45 minutes:
  30.55% (wt.) Polyhydroxyether Solution** (PKHW-35 from Phenoxy Associates, SC)
  62.03 Flake Silver (Flake with D50 of 3–6 microns)
  7.42 Butyl Cellosolve Solvent (from Union Carbide, Inc.)
  **Polyhydroxyether solution consists of the following:
  25.0% Modified Polyhydroxy Ether (Phenoxy) Resin
  6.85 Butyl Cellosolve Solvent
  68.15 Water The resulting paste was screen printed on to a polyester substrate and cured at 120° C. for 5 minutes. The resistivity of the paste was approximately 30 milliohm/sq/mil. Adhesion of the cured paste to the polyester was quite acceptable.

What is claimed:

1. A thick film water based conductive composition comprising, based on total composition:
   (a) 5–40% wt. first aqueous dispersion of polyhydroxyether polymer grafted with at least one acrylic or methacrylic monomer wherein the dispersion is 25–40% wt. grafted polymer solids;
   (b) 20–80% wt. finely divided metallic electrically conductive particles selected from the group consisting of silver, copper, nickel, silver coated copper, silver coated nickel, carbon, graphite and mixtures thereof;
   (c) 0–20% by wt. second aqueous dispersion of an acrylic or polyurethane polymer wherein the dispersion is 25–40% wt. polymer solids;
   (d) 0–5% wt. water soluble polymer; and wherein all of (a), (b), (c) and (d) are dispersed in water and about 1–8% wt. co-solvent.

2. The composition of claim 1 wherein the electrically conductive particles are 30–80% wt. of the total composition and selected from the group consisting of silver, copper, nickel, silver coated copper, silver coated nickel and mixtures thereof.

3. The composition of claim 1 wherein the electrically conductive particles are 20–40% wt. of the total composition and selected from the group consisting of carbon, graphite and mixtures thereof.

4. The composition of claim 1 wherein the polyhydroxyether to acrylic or polyurethane ratio is in the range of 9/1 to 6/4 by weight of polymer solids.

5. The composition of claim 1 wherein the co-solvent is selected from the group consisting of the glycols and the alkanols.

6. The composition of claim 1 wherein the water soluble polymer (d) is selected from the group consisting of polyacrylic acid, polyacrylamide, polyvinyl alcohol, poly(ethylene oxide), polyvinylpyrrolidone, polyvinylpyrrolidone-vinyl acetate copolymer or mixtures thereof.

7. The composition in claim 2 wherein the electrically conductive particles are metal flakes with particle size in the range of 1–30 micron.

8. The composition of claim 2 wherein the electrically conductive particles further comprise 2–30 wt. silver chloride particles in a silver based conductive composition.

9. The composition of claim 2 wherein the first aqueous polymer dispersion is 5–25% wt. of the total composition.

10. The composition of claim 3 wherein the first aqueous polymer dispersion is 15–25% wt of the total composition.

* * * * *